(12) United States Patent
Liu et al.

(10) Patent No.: US 8,321,164 B2
(45) Date of Patent: Nov. 27, 2012

(54) METHOD AND SYSTEM FOR DETERMINING A STATE OF CHARGE OF A BATTERY BASED ON A TRANSIENT RESPONSE

(75) Inventors: Wei Liu, Warren, MI (US); Michael J. Gielniak, Atlanta, GA (US); Jian Lin, Beverly Hills, MI (US); Brian J. Koch, Berkley, MI (US); Damon R. Frisch, Troy, MI (US); Joseph M. Lograsso, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 548 days.

(21) Appl. No.: 12/238,224

(22) Filed: Sep. 25, 2008

(65) Prior Publication Data
US 2010/0076705 A1    Mar. 25, 2010

(51) Int. Cl.
*G01R 31/36* (2006.01)
(52) U.S. Cl. .......... 702/63; 320/104; 320/124; 320/149; 702/57; 324/426; 324/427
(58) Field of Classification Search ...................... 702/63
See application file for complete search history.

(56) References Cited

U.S. PATENT DOCUMENTS

| | | | |
|---|---|---|---|
| 4,585,985 A * | 4/1986 | Bose ............................. | 318/803 |
| 6,359,419 B1 | 3/2002 | Verbrugge et al. | |
| 6,441,586 B1 * | 8/2002 | Tate, Jr. et al. ................ | 320/132 |
| 6,639,385 B2 | 10/2003 | Verbrugge et al. | |
| 7,109,685 B2 | 9/2006 | Tate, Jr. et al. | |
| 7,324,902 B2 | 1/2008 | Verbrugge et al. | |
| 2003/0206021 A1 * | 11/2003 | Laletin et al. ................. | 324/426 |
| 2004/0100227 A1 * | 5/2004 | Yumoto et al. ................ | 320/151 |
| 2005/0154544 A1 * | 7/2005 | Ono ............................... | 702/63 |
| 2006/0176022 A1 * | 8/2006 | Namba ......................... | 320/130 |
| 2006/0284600 A1 * | 12/2006 | Verbrugge .................... | 320/132 |
| 2007/0031732 A1 * | 2/2007 | Chiang et al. ............ | 429/231.95 |
| 2008/0135316 A1 | 6/2008 | Koch et al. | |
| 2009/0302855 A1 | 12/2009 | Lin et al. | |

OTHER PUBLICATIONS

Ljung, L. et al. "System Identification Theory for the User," pp. 303-307, Prentice-Hall, Inc. Englewood Cliffs, New Jersey 07632.
Nise, N. S. et al. "Control Systems Engineering," pp. 202-205, The Fourth edition, John Wiley & Sons, Inc.
Piller, S. et al. "Methods for state-of-charge determination and their applications," Journal of Power Sources, 2001, pp. 113-120, vol. 96.
Salkind, A. J. et al. "Determination of state-of-charge and state-of-health of batteries by fuzzy logic methodology," Journal of Power Sources, 1999, pp. 293-300, vol. 80.

* cited by examiner

*Primary Examiner* — Andrew Schechter
*Assistant Examiner* — Haidong Zhang
(74) *Attorney, Agent, or Firm* — Ingrassia Fisher & Lorenz, P.C.

(57) ABSTRACT

Methods and systems for determining a state of charge of a battery exhibiting a transient response are provided. At least one property of the battery is measured. The state of charge of the battery is determined based on the at least one measured property and a transient response of the battery.

20 Claims, 5 Drawing Sheets

TABLE 1 EXAMPLE OF THE PRIME DOMINANT POLE POSITION VALUE

| SOC/TEMP | -45C° | -30C° | -20C° | -10C° | 0C° | 10C° | 20C° | 30C° | 40C° |
|---|---|---|---|---|---|---|---|---|---|
| 10% | -0.4 | -0.35 | -0.35 | -0.35 | -0.32 | -0.32 | -0.30 | -0.30 | -0.30 |
| 20% | -0.3 | -0.3 | -0.3 | -0.3 | -0.28 | -0.27 | -0.25 | -0.25 | -0.25 |
| 30% | -0.29 | -0.25 | -0.25 | -0.25 | -0.24 | -0.22 | -0.21 | -0.21 | -0.21 |
| 40% | -0.27 | -0.21 | -0.21 | -0.21 | -0.22 | -0.20 | -0.18 | -0.18 | -0.18 |
| 50% | -0.25 | -0.19 | -0.19 | -0.19 | -0.20 | -0.18 | -0.16 | -0.16 | -0.16 |
| 60% | -0.22 | -0.17 | -0.17 | -0.17 | -0.17 | -0.16 | -0.15 | -0.15 | -0.15 |
| 70% | -0.18 | -0.15 | -0.15 | -0.15 | -0.16 | -0.15 | -0.14 | -0.14 | -0.14 |
| 80% | -0.22 | -0.16 | -0.16 | -0.16 | -0.17 | -0.16 | -0.15 | -0.15 | -0.15 |
| 90% | -0.25 | -0.17 | -0.17 | -0.17 | -0.18 | -0.17 | -0.16 | -0.16 | -0.16 |
| 100% | -0.27 | -0.18 | -0.18 | -0.18 | -0.20 | -0.18 | -0.18 | -0.18 | -0.18 |

TABLE 1 EXAMPLE OF THE PRIME DOMINANT POLE POSITION VALUE

| SOC/TEMP | -45C° | -30C° | -20C° | -10C° | 0C° | 10C° | 20C° | 30C° | 40C° |
|---|---|---|---|---|---|---|---|---|---|
| 10% | -0.4 | -0.35 | -0.35 | -0.35 | -0.32 | -0.32 | -0.30 | -0.30 | -0.30 |
| 20% | -0.3 | -0.3 | -0.3 | -0.3 | -0.28 | -0.27 | -0.25 | -0.25 | -0.25 |
| 30% | -0.29 | -0.25 | -0.25 | -0.25 | -0.24 | -0.22 | -0.21 | -0.21 | -0.21 |
| 40% | -0.27 | -0.21 | -0.21 | -0.21 | -0.22 | -0.20 | -0.18 | -0.18 | -0.18 |
| 50% | -0.25 | -0.19 | -0.19 | -0.19 | -0.20 | -0.18 | -0.16 | -0.16 | -0.16 |
| 60% | -0.22 | -0.17 | -0.17 | -0.17 | -0.17 | -0.16 | -0.15 | -0.15 | -0.15 |
| 70% | -0.18 | -0.15 | -0.15 | -0.15 | -0.16 | -0.15 | -0.14 | -0.14 | -0.14 |
| 80% | -0.22 | -0.16 | -0.16 | -0.16 | -0.17 | -0.16 | -0.15 | -0.15 | -0.15 |
| 90% | -0.25 | -0.17 | -0.17 | -0.17 | -0.18 | -0.17 | -0.16 | -0.16 | -0.16 |
| 100% | -0.27 | -0.18 | -0.18 | -0.18 | -0.20 | -0.18 | -0.18 | -0.18 | -0.18 |

*FIG. 7*

TABLE 2 EXAMPLE OF THE SECOND DOMINANT POLE POSITION VALUE

| SOC/TEMP | -45C° | -30C° | -20C° | -10C° | 0C° | 10C° | 20C° | 30C° | 40C° |
|---|---|---|---|---|---|---|---|---|---|
| 10% | -1.25 | -1.15 | -1.05 | -1.05 | -0.95 | -0.95 | -0.95 | -0.95 | -0.92 |
| 20% | -1.15 | -1.05 | -1.0 | -1.0 | -0.93 | -0.93 | -0.93 | -0.93 | -0.90 |
| 30% | -1.09 | -0.95 | -0.97 | -0.97 | -0.90 | -0.90 | -0.90 | -0.90 | -0.88 |
| 40% | -1.08 | -0.90 | -0.95 | -0.95 | -0.88 | -0.88 | -0.88 | -0.88 | -0.86 |
| 50% | -0.95 | -0.88 | -0.91 | -0.91 | -0.86 | -0.86 | -0.86 | -0.86 | -0.84 |
| 60% | -0.90 | -0.85 | -0.88 | -0.88 | -0.84 | -0.84 | -0.84 | -0.84 | -0.83 |
| 70% | -0.87 | -0.80 | -0.85 | -0.85 | -0.80 | -0.80 | -0.80 | -0.80 | -0.81 |
| 80% | -0.90 | -0.83 | -0.88 | -0.88 | -0.83 | -0.83 | -0.83 | -0.83 | -0.84 |
| 90% | -0.93 | -0.90 | -0.90 | -0.90 | -0.86 | -0.86 | -0.86 | -0.86 | -0.86 |
| 100% | -0.95 | -0.95 | -0.95 | -0.95 | -0.88 | -0.88 | -0.88 | -0.88 | -0.88 |

*FIG. 8*

ND A SYSTEM FOR DETERMINING
A STATE OF CHARGE OF A BATTERY
BASED ON A TRANSIENT RESPONSE

TECHNICAL FIELD

The present invention generally relates to electrochemical power sources, such as batteries, and more particularly relates to methods and systems for determining the state of charge of a battery.

BACKGROUND OF THE INVENTION

In recent years, advances in technology, as well as ever-evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles often use electrochemical power sources, such as batteries, ultracapacitors, and fuel cells, to power the electric motors that drive the wheels, sometimes in addition to another power source, such as an internal combustion engine. An important parameter in the operation of vehicles that utilize batteries is the "state of charge" (SOC). The state of charge refers to the amount of stored energy in the battery that is available to be used at any given time relative to the amount of stored energy that is available when the battery is fully charged. An accurate determination of the state of charge allows for the vehicles to maximize performance and fuel economy or minimize emissions.

In automotive applications, a conventional approach for batteries is to relate either a measured or calculated open circuit voltage to the state of charge. This is feasible because the open circuit voltage, which is the resting voltage of the battery when no load is applied, generally exhibits some observable dependence on the battery's state of charge. There are batteries, however, such as nickel metal hydride and some types of lithium ion batteries, such as lithium iron phosphate batteries (e.g., nanophosphate lithium ion batteries), which possess a nearly constant open circuit voltage across most of the range of state of charge. In other words, the open circuit voltage reveals little about the state of charge of the battery. For example, in some nanophosphate lithium ion batteries, increases in the state of charge from 0% to 100% results in only a 7% change in the open circuit voltage.

Therefore, while these batteries are highly desirable as power sources for electric and hybrid vehicles because of their low mass, high power capability, and large energy storage capacity, they present a problem with regard to control because it is very difficult to estimate their state of charge with any degree of certainty.

Other techniques have also been used to determine the state of charge of batteries, such as ampere-hour (Ah) counting and electrochemical impedance spectroscopy (EIS). However, they too have drawbacks in automotive applications due to, for example, accuracy and/or high implementation costs.

Accordingly, it is desirable to provide a method and a system for determining the state of charge of a battery that is not based on, or solely based on, open circuit voltage or current flow. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method for determining a state of charge of a battery exhibiting a transient response is provided. At least one property of the battery is measured. The state of charge of the battery is determined based on the at least one measured property and the transient response of the battery.

A method for determining a state of charge of a nanophosphate lithium ion battery is provided. At least one property of the nanophosphate lithium ion battery is measured. A location of a system pole of the nanophosphate lithium ion battery is determined based on the at least one measured property and an ordinary differential equation. The state of charge of the nanophosphate lithium ion battery is determined based on the location of the system pole of the nanophosphate lithium ion battery.

An automotive drive system is provided. The automotive drive system includes an electric motor, a battery coupled to the electric motor, a sensor assembly coupled to the battery and configured to detect at least one property of the battery and generate a signal representative thereof, and a processor in operable communication with the sensor assembly. The processor is configured to receive the signal from the sensor assembly and determine the state of charge of the battery based on the measured property and a transient response of the battery.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-9 are merely illustrative and may not be drawn to scale.

FIG. 1 to FIG. 9 illustrate systems and methods for determining a state of charge of a battery. A transient response of a battery is indicative of the state of charge of the battery, and system pole locations of the battery are indicative of the transient response. A dynamic model of the battery is identified and used to solve for the pole locations under known operating conditions of the battery top generate a mapping between the pole locations (and/or the known conditions of the battery) and the state of charge of the battery. In one embodiment, in an automobile, real-time measurements are used in conjunction with the mapping to determine the state of charge of the battery.

Figure 1:
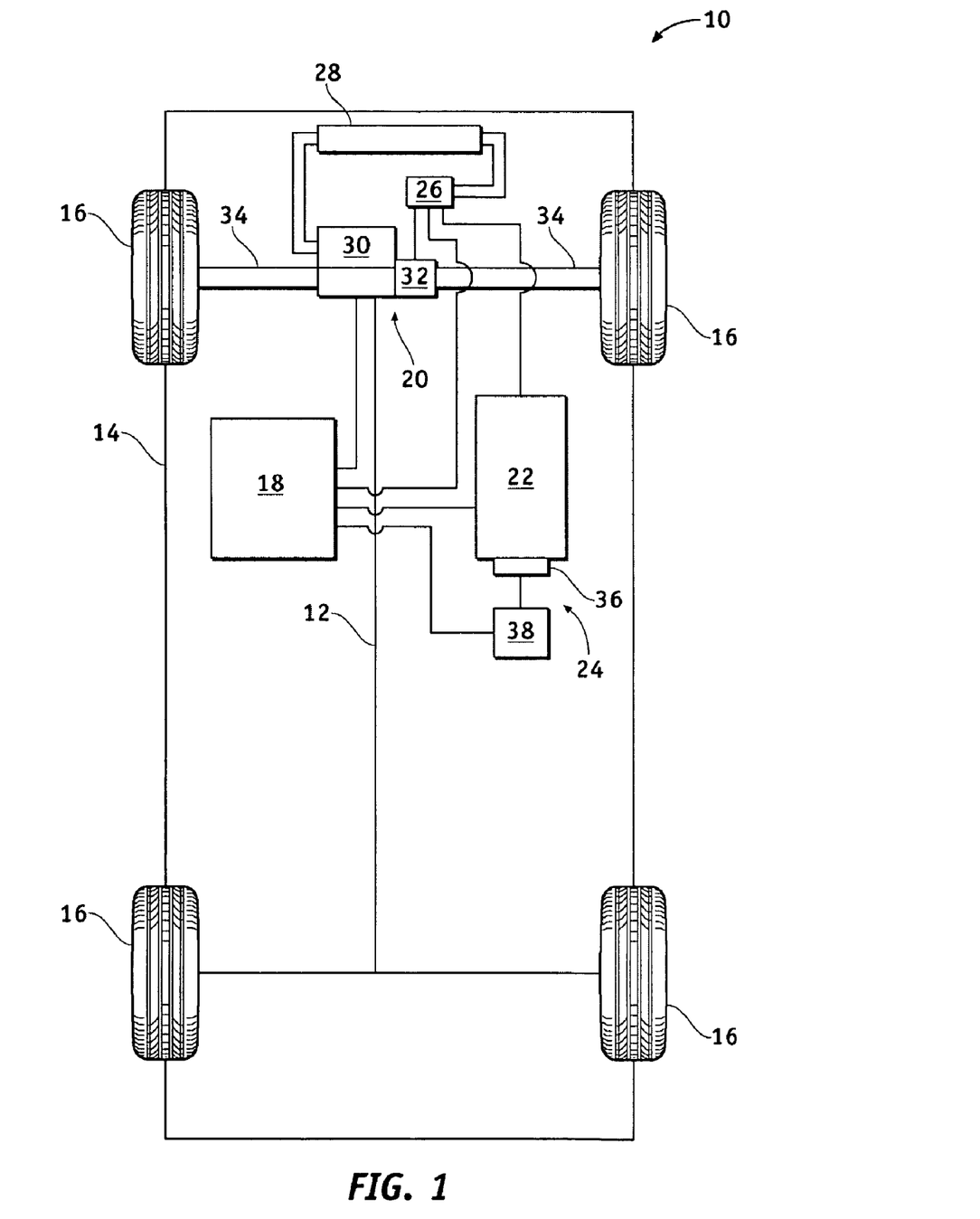
FIG. 1 is a schematic view of an exemplary automobile according to one embodiment of the present invention.

FIG. 1 illustrates a vehicle 10, or "automobile," according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid electric vehicle (HEV), and further includes an actuator assembly 20, a battery 22, a state of charge (SOC) system 24, a power inverter assembly (or inverter) 26, and a radiator 28. The actuator assembly 20 includes a combustion engine 30 and an electric motor/generator (or motor) 32. As will be appreciated by one skilled in the art, the electric motor 32 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 32 may include multiple electromagnetic poles (e.g., sixteen poles), as is commonly understood.

Still referring to FIG. 1, and as described in greater detail below, the combustion engine 30 and the electric motor 32 are integrated such that one or both are mechanically coupled to at least some of the wheels 16 through one or more drive shafts 34. In one embodiment, the automobile 10 is a "series HEV," in which the combustion engine 30 is not directly coupled to the transmission, but coupled to a generator (not shown), which is used to power the electric motor 32. In another embodiment, the automobile 10 is a "parallel HEV," in which the combustion engine 30 is directly coupled to the transmission by, for example, having the rotor of the electric motor 32 rotationally coupled to the drive shaft of the combustion engine 30.

The battery 22 is electrically connected to the inverter 26 and, in one embodiment, is a lithium iron phosphate battery, such as a nanophosphate lithium ion battery, including a plurality of cells, as is commonly understood. Nanophosphate lithium ion batteries exhibit excellent power performance in over a wide range of temperatures. One of the advantages of nanophosphate lithium ion batteries, in terms of power capability, is that the open circuit voltage is not sensitive to SOC. As indicated by line in FIG. 3, in one exemplary nanophosphate lithium ion battery, open circuit voltage varies only about 20 mv per 10% SOC change. Although such a property is beneficial with regards to vehicle performance, it causes technical challenges in determining the state of charge of the battery when using a voltage-based approach.

The SOC system 24 includes a sensor array 36 and a SOC module 38. Although not shown in detail, the sensor array 36 includes a current sensor, a voltage sensor, and a temperature sensor located adjacent to the battery 22 (or more particularly within the battery/inverter circuit shown in FIG. 2). The SOC module 38 is in operable communication with the sensor array 36 and in one embodiment includes at least one processor and/or a memory that includes data relating measured properties and system pole locations of the battery 22 to the state of charge of the battery 22, as is described in greater detail below. Although not illustrated as such, the SOC module 38 may be integral with the electronic control system 18 and may also include one or more power sources.

The radiator 28 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 30 and the inverter 26.

Figure 2:
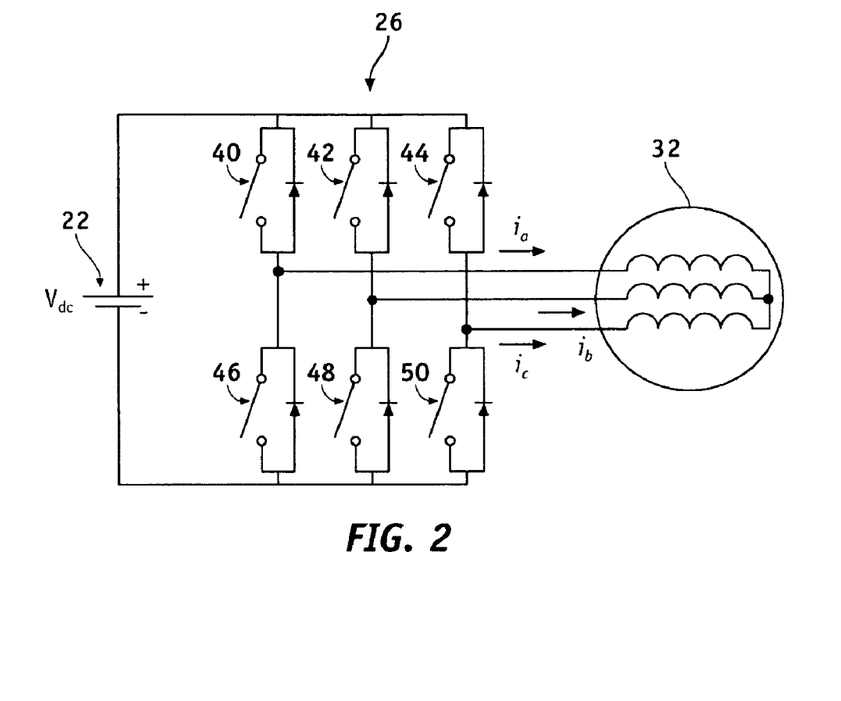
FIG. 2 is a schematic view of an inverter within the automobile of FIG. 1.
Figure 3:
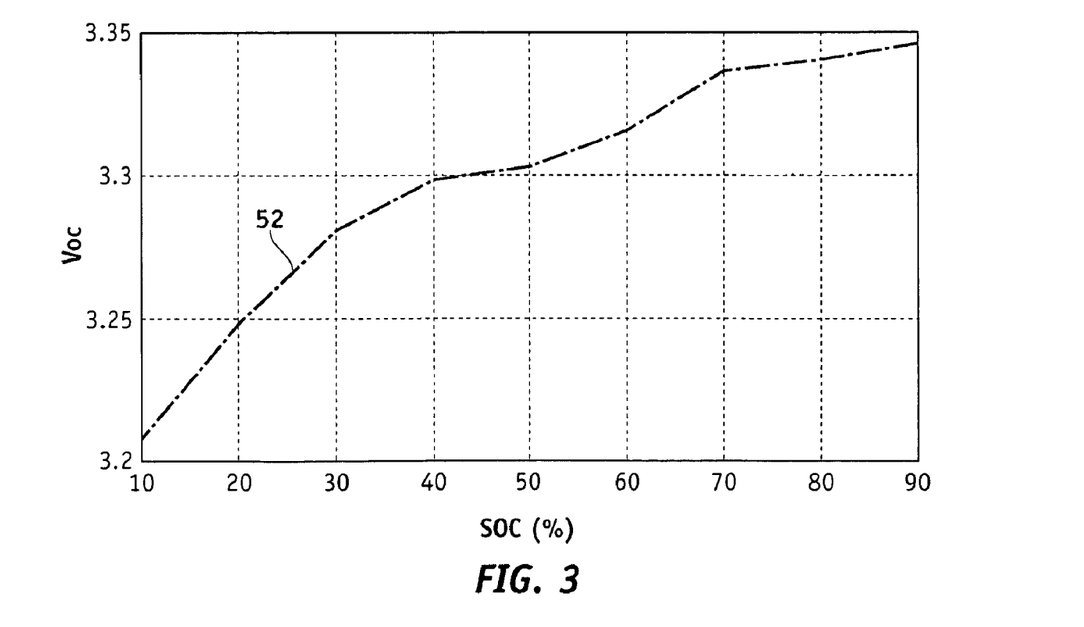
FIG. 3 is a graphical comparison of open circuit voltages of a battery at various states of charge.

FIG. 2 illustrates the inverter 26 in greater detail. The inverter 26 includes a three-phase circuit coupled to the motor 32. More specifically, the inverter 26 includes a switch network having a first input coupled to a voltage source $V_{dc}$ (e.g., the battery 22) and an output coupled to the motor 32. Although a single voltage source is shown, a distributed direct current (DC) link with two series sources may be used. The switch network comprises three pairs (a, b, and c) of series switches with antiparallel diodes (i.e., antiparallel to each switch) corresponding to each of the phases of the motor 32. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and having a first terminal coupled to a second terminal of the respective first switch 40, 42, and 44.

Referring again to FIG. 1, the electronic control system 18 is in operable communication with the actuator assembly 20, the battery 22, the SOC system 24, and the inverter 26. Although not shown in detail, the electronic control system 18 (and/or the SOC module 38) includes various sensors and automotive control modules, or electronic control units (ECUs), such as a body control module (BCM), and at least one processor and/or a memory which includes instructions stored thereon (or in another computer-readable medium) for carrying out the processes and methods as described below.

During operation, still referring to FIG. 1, the automobile 10 is operated by providing power to the wheels 16 with the combustion engine 30 and the electric motor 32 in an alternating manner and/or with the combustion engine 30 and the electric motor 32 simultaneously. In order to power the electric motor assembly 30, DC power is provided from the battery 22 to the inverter 26, which converts the DC power to alternating current (AC) power, prior to energizing the electric motor 32.

According to one aspect of the present invention, a transient response characteristic-based approach to determine the state of charge of a battery is provided. A mathematical model of the battery is determined (or identified) in which the dynamic components of the battery are considered as a system and described by a system equation, in which resistance and capacitance are described with a differential equation. The order of the system (i.e., the differential equation) is estimated through system identification techniques based on the preliminary test data, such as hybrid pulse power characterization (HPPC) tests. The relationship between battery state of charge and system poles are established based on the HPPC test data. The parameters of the differential equation (i.e., the system parameters) are estimated in real-time by an online parameter estimation method. Based on the identified system order and estimated parameters, the system's poles, or location of the poles, are calculated, also in real-time. The pole locations correspond to the transient-response-characteristics, which are indicative of the state of charge of the battery. Therefore, the battery state of charge is determined based on the pole locations.

Figure 4:
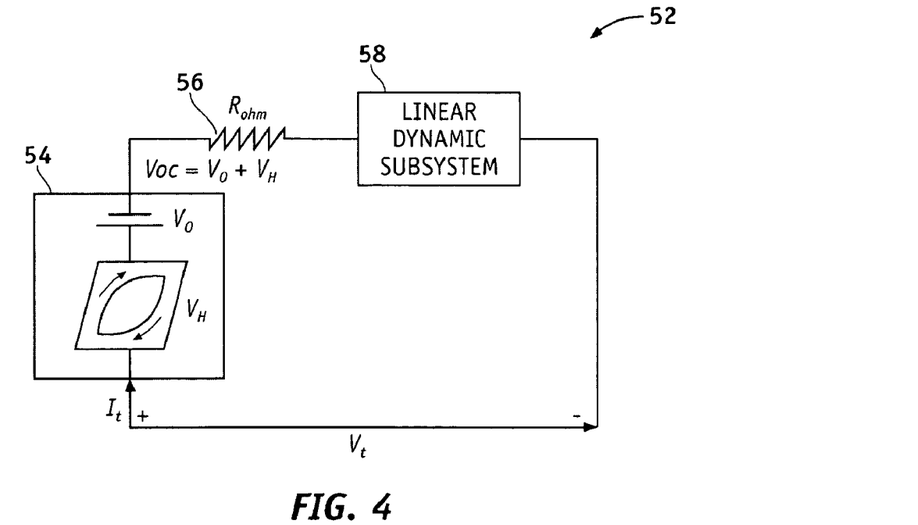
FIG. 4 is a schematic view of a dynamic model of a battery.

FIG. 4 illustrates a simplified circuit (or battery) 52 that represents a battery model according to one embodiment of the present invention. The circuit 52 includes a voltage (or power) source 54, a resistor 56, and an $n^{th}$-order linear dynamic subsystem 58.

Figure 5:
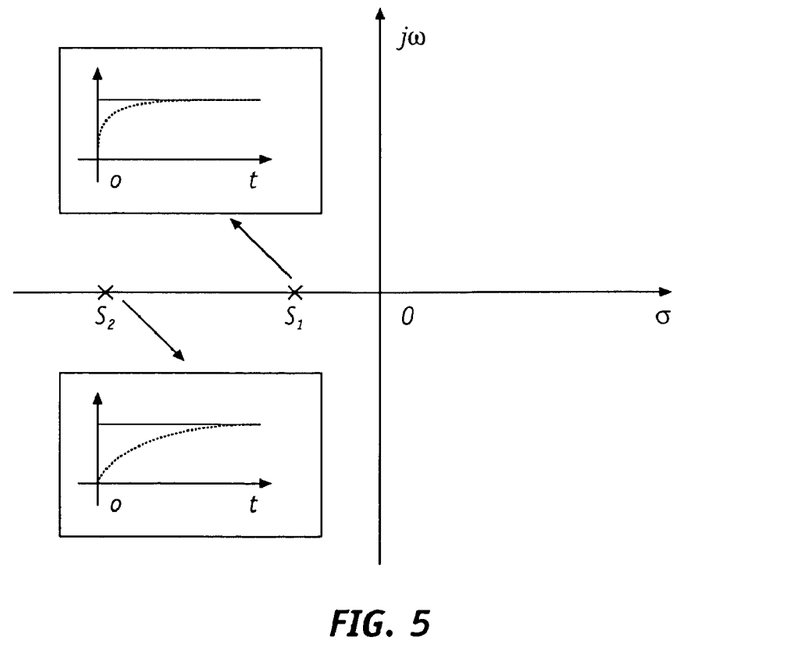
FIG. 5 is a schematic illustration of transient responses of a battery compared to locations of system poles of the battery.

Linear system theory dictates that system pole and zero locations determine the system's transient characteristics (i.e. a system's transient characteristic varies with system pole locations). FIG. 5 illustrates how the system transient response varies with pole location using an example of a first order system (i.e. a single pole system). As the state of charge of the battery changes, the battery's response to load changes also changes. In particular, as indicated in FIG. 5, at a first system pole location ($s_1$), the system exhibits a first transient response 60. At a second system pole location ($s_2$), the system exhibits a second transient response 62. As, the system pole becomes more negative, the battery achieves a state of equilibrium more slowly.

Figure 6:
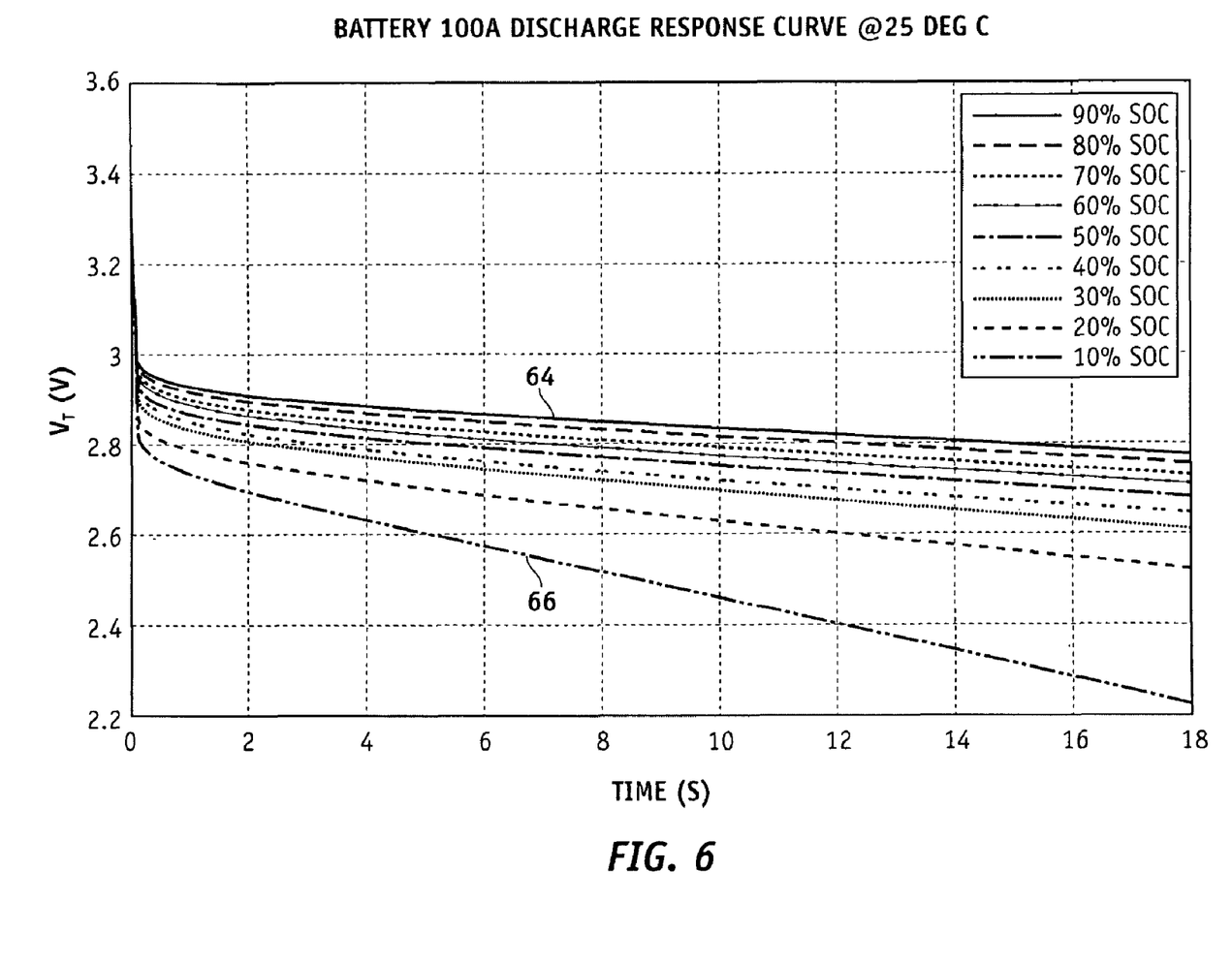
FIG. 6 is a graph useful for comparing measured terminal voltages of a battery at various states of charge (SOC) to a dynamic model.

This relationship is confirmed by FIG. 6 which graphically illustrates the terminal voltage of a nanophosphate lithium ion battery during a 100 A discharge at 25° C. at various states of charge, as determined using hybrid pulse power characterization (HPPC) tests, as are commonly understood. The HPPC tests are performed in conjunction with the battery being coupled to a "cycler" (i.e., a charger/discharger), as is commonly understood, such that the state of charge of the battery is known and may be set to a desired value. At the extremes shown in FIG. 6, line 64 indicates that the battery achieves a state of equilibrium relatively quickly at a 90% state of charge. While line 66 indicates that the battery achieves equilibrium, if at all, relatively slowly. Thus, the locations of the system poles of the nanophosphate lithium ion battery are indicative of the state of charge of the battery.

Generally, the $n^{th}$-order linear dynamic subsystem 58 (FIG. 4) may be described by the $n^{th}$-order ordinary differential equation:

$$V(k) = a_1 * V(k-1) + a_2(t) * v(k-2) + \ldots + \quad (1)$$

$$a_n(k-n) * V(k-n) + b_0 * I(k) + b_1 * I(k-1) + \ldots + b_m I(k-m)$$

or the state space equations:

$$X(k+1) = AX(k) + BI(k) = \begin{bmatrix} a_{11} & a_{12} & \ldots & a_{1n} \\ a_{21} & a_{22} & \ldots & a_{2n} \\ \ldots & \ldots & \ldots & \ldots \\ a_{n1} & a_{n2} & \ldots & a_{nn} \end{bmatrix} X(k) + \begin{bmatrix} b_1 \\ b_2 \\ \ldots \\ b_n \end{bmatrix} I(k) \quad (2)$$

$$V(k) = CX(k) + DI(k) = [c_1 c_2 \ldots c_n]X(k) + d*1(k)$$

where X(k) is the n×1 state vector; I(k) is the input; V(k) is the output; A is an n×n coefficient matrix with constant elements, $$A = \begin{bmatrix} a_{11} & a_{12} & \ldots & a_{1n} \\ a_{21} & a_{22} & \ldots & a_{2n} \\ \vdots & \vdots & & \vdots \\ a_{n1} & a_{n2} & \ldots & a_{nn} \end{bmatrix}, \quad (3)$$

B is an n×1 coefficient matrix with constant elements, $$B = \begin{bmatrix} b_1 \\ b_2 \\ \ldots \\ b_n \end{bmatrix}, \quad (4)$$

C is an 1×n coefficient matrix with constant elements, $$C = [c_1 c_2 \ldots c_n], \quad (5)$$

and D is a constant coefficient, $$D = d. \quad (6)$$

The order of Equation (1) or (2) may be estimated based on the preliminary test data of FIG. 6 by applying Üström's t-criterion, which may be expressed $$t(n_1, n_2) = \frac{J_1 - J_2}{J_2} \cdot \frac{N - 2n_2}{2(n_2 - n_1)}, \quad (7)$$

where N is total number of input/output data pairs and $J_1$ and $J_2$ are the values of the cost function of a parameter estimation algorithm when the system order is estimated as $n_1$ and $n_2$. If N is large enough, t asymptotically converges to $F(f_1, f_2)$-distribution, where $f_1=2(n_2-n_1)$ and $f_2=N-2n_2$ are degrees of freedom.

After deriving the system's order, the parameters of the system may be estimated through an online estimation algorithm such as Recursive Least Squares Algorithm, Recursive Prediction-Error Method, or Kalman Filter. Equation (1) may then be expressed as the z-transfer function after obtaining the estimated parameters $$\frac{\tilde{V}(z)}{I(z)} = \frac{\hat{b}_1 z^{-1} + \hat{b}_2 z^{-2} + \ldots + \hat{b}_{m_0} z^{-m_0}}{1 + \hat{a}_1 z^{-1} + \hat{a}_2 z^{-2} + \ldots + \hat{a}_{n_0} z^{-n_0}}, \quad (8)$$

where $\tilde{V}$ is filtered terminal voltage and I(z) is terminal current, $\hat{a}_i$ and $\hat{b}_i$ are estimated parameters.

Equation (8) may be rewritten in pole/zero form as $$\frac{\tilde{V}(z)}{I(z)} = \frac{k(z+z_1)(z+z_2) \ldots (z+z_{m_0})}{(z+p_1)(z+p_2) \ldots (z+p_{n_0})}, \quad (9)$$

where $z_i$ and $p_j$ are system the $i^{th}$ zero and the $j^{th}$ pole, respectively.

Equation (9) may be written as $$\frac{V(z)}{I(z)} = \frac{K \prod_{i=1}^{m}(z-z_i)}{\prod_{i=1}^{n}(z-p_i)}. \quad (10)$$

In an exemplary embodiment, based on the HPPC data and Uström's criterion, the system is considered to be second order, in which case Equation (1) may be re-expressed as $$V(k)=a_1*V(k-1)+a_2*v(k-2)+b_0*I(k)+b_1*I(k-1)+b_2I(k-2). \quad (11)$$

Given input-output data, the parameters of Equation (2) may be estimated as follows using the Recursive Least Squares Algorithm as $$\hat{\theta}=[\hat{a}_1 \hat{a}_2 \hat{b}_0 \hat{b}_1 \hat{b}_2], \quad (12)$$

where $\hat{\theta}$ is the estimation of the parameters $a_1$ $a_2$ $b_0$ $b_1$ $b_2$ in Equation (7).

The z-transfer function may then be expressed as $$\frac{V(z)}{I(z)} = \frac{\hat{b}_0 + \hat{b}_1 z^{-1} + \hat{b}_2 z^{-2}}{1 + \hat{a}_1 z^{-1} + \hat{a}_2 z^{-2}}, \quad (13)$$

Equation (13) may then be rewritten in discrete pole/zero form as $$\frac{V(z)}{I(z)} = \frac{k(z+z_1')(z+z_2')}{(z+p_1')(z+p_2')}, \quad (14)$$

When converted to the s-transfer function (continuous), Equation (4) may be expressed as $$\frac{V(s)}{I(s)} = \frac{k}{(s+p_1)(s+p_2)}, \quad (15)$$

which represents the s-function transfer form for a 2nd order battery model in a hybrid vehicle application. $p_1$ and $p_2$ should be negative; if $|p_1|*10<|p_2|$, $p_1$ is referred to as the "prime dominant pole" and $p_2$ is referred to as the "second dominant pole."

Figure 7:
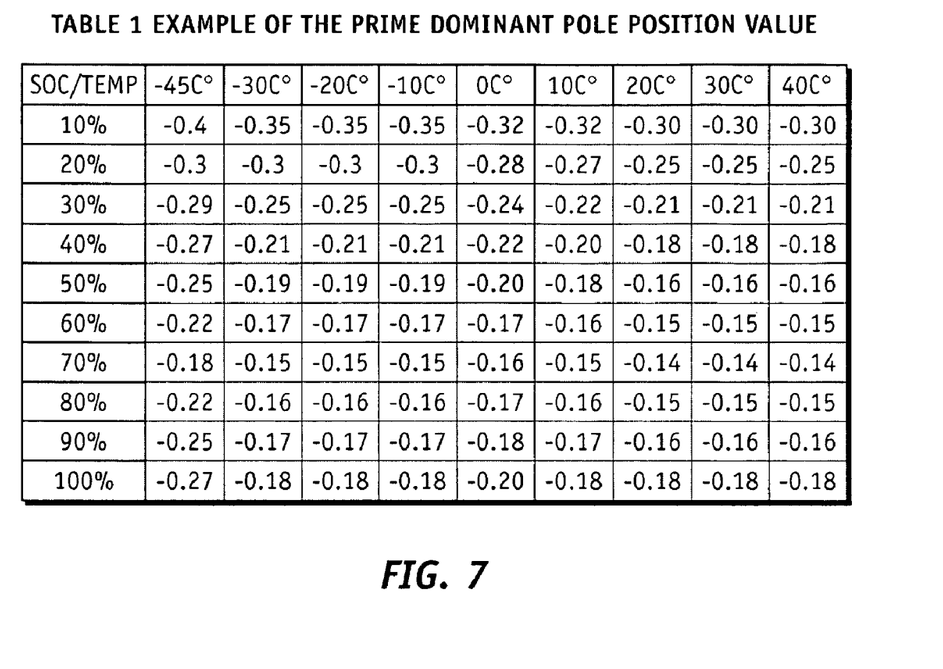
FIGS. 7 and 8 are tables of prime and second dominant poles of the battery, respectively, at various states of charge.
Figure 8:
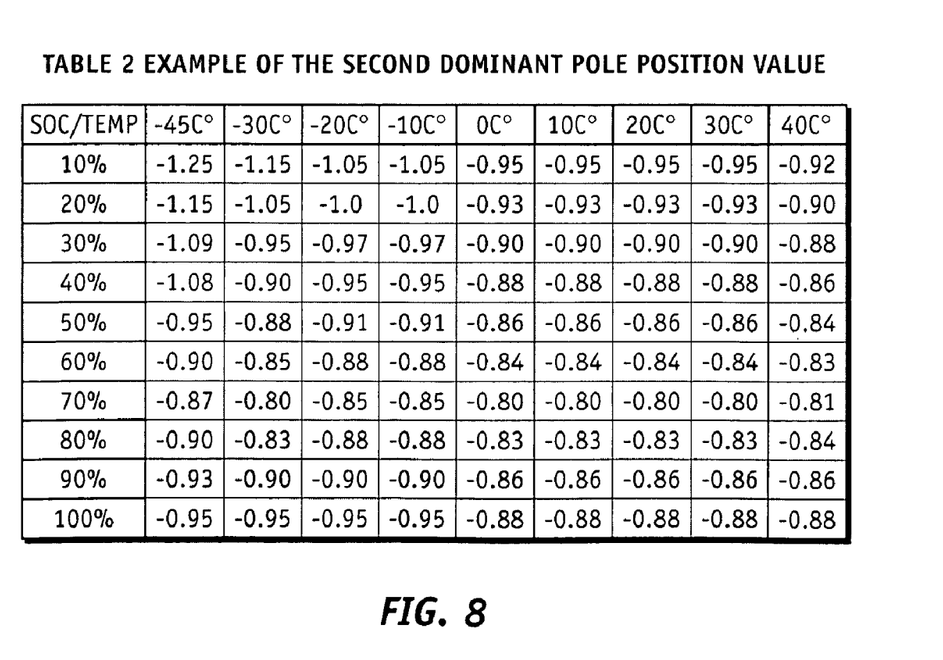

Based on test results similar to those represented in FIG. 6, as well as additional HPPC tests performed at other various temperatures (e.g., −45° C. to 40° C.), look up tables such as those shown in FIGS. 7 and 8 may be generated which are stored, for example, within the SOC module 38 (FIG. 1). Using the measured terminal voltage and current, as well as operating temperature, of the battery 22, the SOC module 38 may then determine the current state of charge of the battery using the look up tables. That is, in one embodiment, the SOC module 38 receives the terminal voltage, terminal current, and operating temperature of the battery 22 as input and generates a signal representative of the state of charge of the battery 22 based using the look up tables.

One advantage of the method and system described above is that because the state of charge of the battery is determined without using the open circuit voltage of the battery, the use of batteries with relatively invariant open circuit voltage, such as some nanophosphate lithium ion batteries, is facilitated.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining a state of charge of a battery exhibiting a transient response, the method comprising:
providing a lookup table that corresponds to the at least one measured property of the battery, wherein the lookup table comprises various states of charge of the battery that correspond to locations of system poles and to temperatures of the battery;
measuring an actual measured temperature and at least one measured property of the battery;
determining a location of a system pole of the battery based on an ordinary differential equation and the at least one measured property of the battery; and
determining the state of charge of the battery from the lookup table based on the actual measured temperature and the determined location of the system pole.

2. The method of claim 1, wherein the at least measured property comprises a current, a voltage, or a combination thereof.

3. The method of claim 1, wherein the ordinary differential equation comprises a plurality of parameters.

4. The method of claim 1, wherein the transient response of the battery varies based on the load conditions of the battery, and wherein the load conditions vary based on one or more properties of the battery that are related to the state of charge of the battery, and wherein the transient response of the battery is either:
a diffusion voltage of the battery,
a double layer capacitance of the battery, or
a combination thereof.

5. The method of claim 3, wherein the step of determining the location of the system pole of the battery based on the ordinary differential equation and the at least one measured property of the battery, further comprises:
determining the parameters of the ordinary differential equation that characterize the battery, wherein the parameters comprise comprises a terminal current and a terminal voltage.

6. The method of claim 1, wherein the look up table comprises a plurality of determined locations of the system pole and a plurality of known states of charge of the battery, each of the known states of charge that correspond to one of the determined locations of the system pole of the battery.

7. The method of claim 1, wherein the battery is an automotive battery installed in an automobile and the measuring of the at least one measured property is performed with a sensor onboard the automobile.

8. The method of claim 1, wherein the battery is a nanophosphate lithium ion battery.

9. The method of claim 1, wherein the at least one measured property comprises a measured terminal current and a measured terminal voltage.

10. The method of claim 1, further comprising:
estimating parameters of the ordinary differential equation that characterize the battery;
generating, based on the ordinary differential equation, a transfer function of the battery that includes one or more system poles each having a location that varies based on the transient response of the battery; and
generating, based on the transfer function, the lookup table comprising various states of charge of the battery that correspond to locations of system poles and temperatures of the battery.

11. A method for determining a state of charge of a nanophosphate lithium ion battery, the method comprising:
providing a lookup table that corresponds to the at least one measured property of the nanophosphate lithium ion battery, wherein the lookup table comprises various states of charge of the nanophosphate lithium ion battery that correspond to locations of system poles and to temperatures of the nanophosphate lithium ion battery;
measuring an actual measured temperature and at least one measured property of the nanophosphate lithium ion battery;
determining a location of a system pole of the nanophosphate lithium ion battery based on the at least one measured property and an ordinary differential equation; and
determining the state of charge of the nanophosphate lithium ion battery from the lookup table based on the actual measured temperature and the determined location of the system pole of the nanophosphate lithium ion battery.

12. The method of claim 11, wherein the lookup table comprises a plurality of determined locations of the system poles and a plurality of known states of charge of the nanophosphate lithium ion battery, each of the known states of charge that correspond to one of the determined locations of the system pole of the nanophosphate lithium ion battery.

13. The method of claim 12, wherein the ordinary differential equation comprises a plurality of parameters and the determining of the location of the system pole of the nanophosphate lithium ion battery, further comprises:
determining the parameters of the ordinary differential equation based on the at least one measured property.

14. The method of claim 13, wherein the nanophosphate lithium ion battery is an automotive battery onboard an automobile and the measuring of the at least one property is performed with at least one sensor onboard the automobile.

15. The method of claim 14, wherein the at least one measured property of the nanophosphate lithium ion battery comprises a measured terminal current and a measured terminal voltage of the nanophosphate lithium ion battery.

16. The method of claim 11, further comprising:
estimating parameters of the ordinary differential equation that characterize the nanophosphate lithium ion battery;
generating, based on the ordinary differential equation, a transfer function of the nanophosphate lithium ion battery that includes one or more system poles each having a location that varies based on the transient response of the nanophosphate lithium ion battery; and
generating, based on the transfer function, the lookup table comprising various states of charge of the nanophosphate lithium ion battery that correspond to locations of system poles and temperatures of the nanophosphate lithium ion battery.

17. An automotive drive system comprising:
an electric motor;
a battery coupled to the electric motor;
a sensor assembly coupled to the battery and configured to measure an actual measured temperature of the battery and to detect at least one measured property of the battery and generate a signal representative thereof;
a processor in operable communication with the sensor assembly; and
a memory in operable communication with the processor, the memory having a look up table stored thereon, wherein the look up table comprises various states of charge of the battery that correspond to locations of system poles and temperatures of the battery, wherein the processor is configured to:
receive the signal from the sensor assembly;
determine a location of a system pole of the battery based on an ordinary differential equation and the at least one measured property of the battery; and
determine the state of charge of the battery from the lookup table based on the actual measured temperature and the determined location of the system pole.

18. The system of claim 17, wherein the look up table comprises: a plurality of determined locations of the system pole and a plurality of known states of charge of the battery, each of the known states of charge that correspond to one of the determined locations of the system pole of the battery.

19. The system of claim 18, wherein the battery is an automotive battery installed in an automobile and the measuring of the at least one property is performed with a sensor onboard the automobile.

20. The system of claim 19, wherein the battery is a nanophosphate lithium ion battery and the at least one measured property comprises a measured terminal current and a measured terminal voltage.

* * * * *